United States Patent [19]
Tottori et al.

[11] Patent Number: 5,394,608
[45] Date of Patent: Mar. 7, 1995

[54] LAMINATED SEMICONDUCTOR DEVICE AND FABRICATING METHOD THEREOF

[75] Inventors: Takeshi Tottori, Ibaraki; Satoshi Yamagata; Kazunari Nakagawa, both of Toride; Toshiharu Ochiai, Mitsukaido, all of Japan

[73] Assignee: Hitachi Maxwell, Ltd., Osaka, Japan

[21] Appl. No.: 43,800

[22] Filed: Apr. 7, 1993

[30]  Foreign Application Priority Data

Apr. 8, 1992 [JP] Japan .................................. 4-087203
Sep. 16, 1992 [JP] Japan .................................. 4-246518

[51] Int. Cl.6 ............................................. H05K 3/34
[52] U.S. Cl. ........................................ 29/840; 29/827; 257/692; 257/724
[58] Field of Search .................... 29/827, 830, 840; 257/692, 724, 735

[56]  References Cited

U.S. PATENT DOCUMENTS 4,437,235 3/1984 McIver .................. 257/724 X
5,028,986 7/1991 Sugano et al. .
5,084,959 2/1992 Ando et al. ............... 29/846 X

FOREIGN PATENT DOCUMENTS 2806685 8/1979 Germany .
55-24479 2/1980 Japan .................... 257/735
6481348 3/1989 Japan .
4-105352 4/1992 Japan .................... 257/692

Primary Examiner—Carl J. Arbes
Attorney, Agent, or Firm—Birch, Stewart, Kolasch & Birch

[57] ABSTRACT

A fabricating method of a laminated semiconductor device wherein two or more semiconductor chips are stacked as tape carrier packages and the tape carrier packages are mounted on at least one side of the printed wiring board so that outer connection leads provided in the tape carrier packages are stacked to be connected to the terminal porions of the printed wiring package, which includes stacking two or more tape carrier packages and aligning the outer connection leads of the tape carrier packages in the stacked direction, temporarily bonding the stacked outer connection leads to one another to combine the stacked tape carrier packages into one block, and placing the block on the printed wiring board and passing the terminal portions formed on the printed wiring board and lowermost outer connection leads of the block through a heating furnace to thereby solder them.

16 Claims, 10 Drawing Sheets

F I G. 10
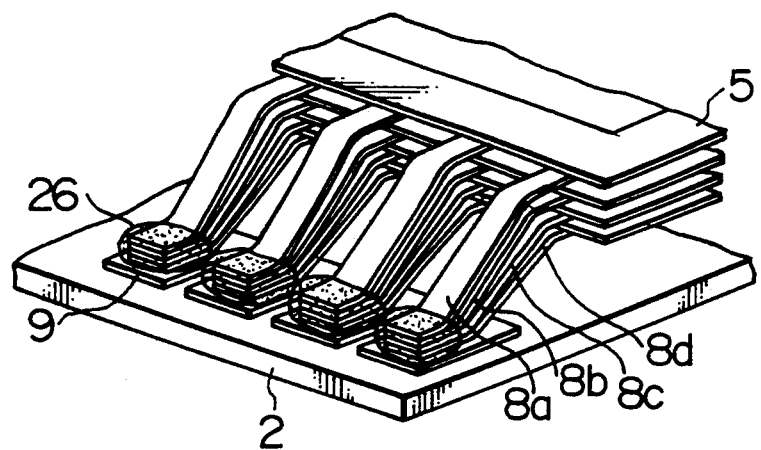
F I G. 11
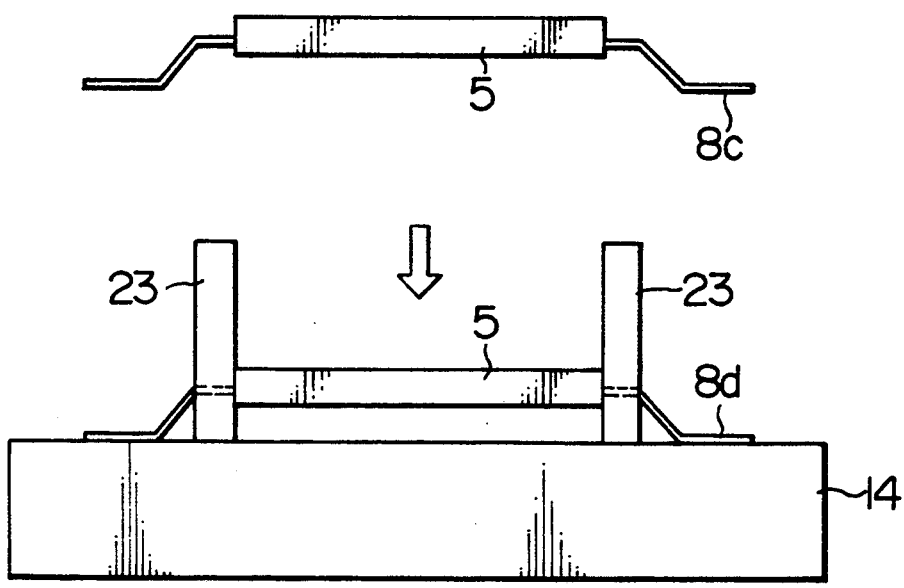

F I G. 21
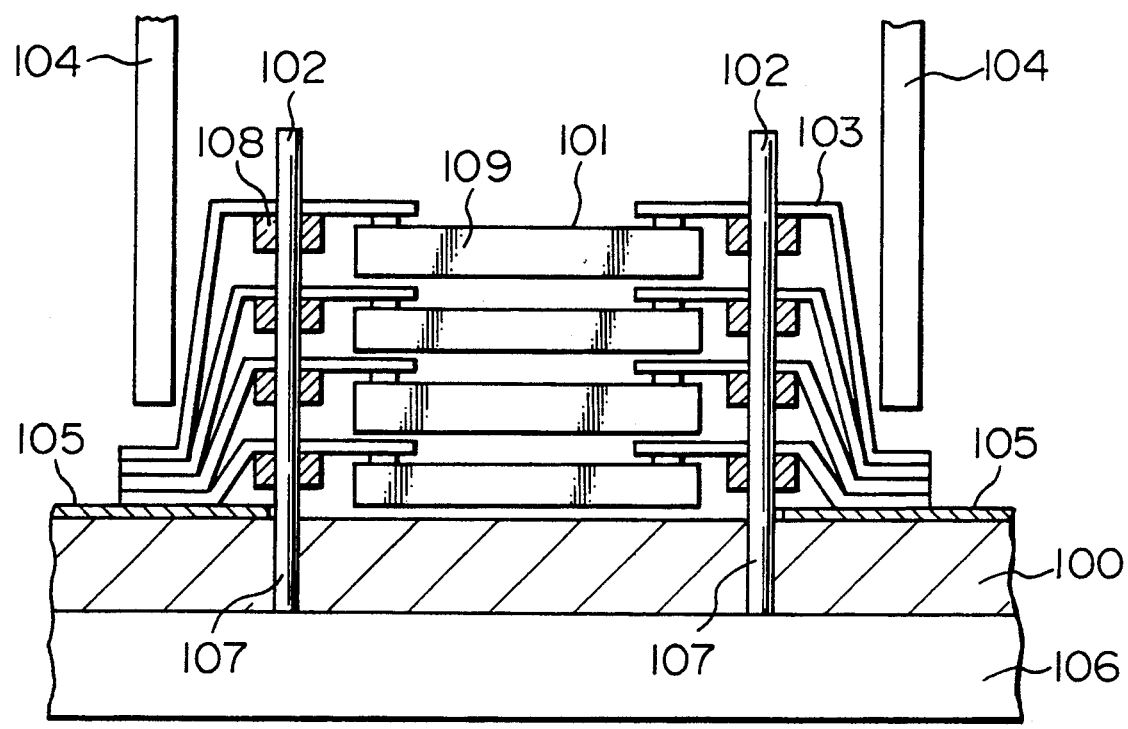
F I G. 22
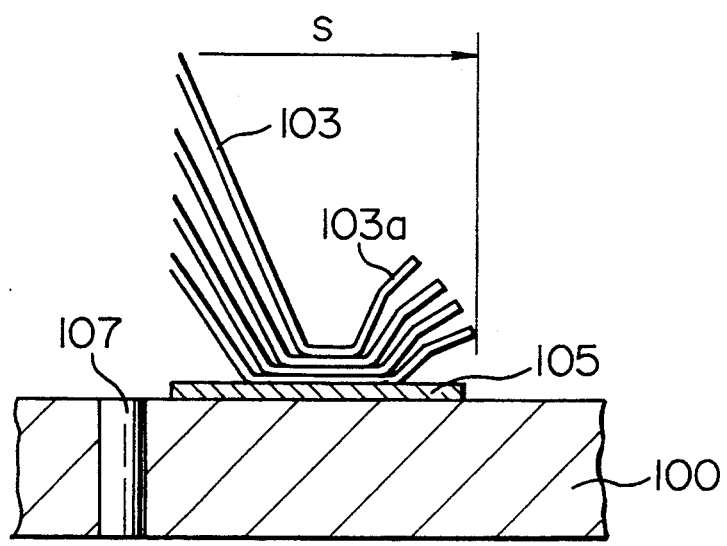

LAMINATED SEMICONDUCTOR DEVICE AND FABRICATING METHOD THEREOF

BACKGROUND OF THE INVENTION

1. Field of the Invention

The present invention relates to a laminated semiconductor device and a fabricating method of the device including two or more stacked IC packages such as, for example, TCP's (Tape Carrier Packages) and TSOP's (Thin Small Outline Packages) mounted on at least one side of a printed wiring board and outer connection leads provided in the IC packages and stacked to be connected to terminal portions (lands) of the printed wiring board, and more particularly to fixing means of the outer connection leads to the printed wiring board.

1. Discussion of Related Art

The TCP includes a film of synthetic resin having feeding holes formed in both side thereof and leads of copper leaf or foil formed on the film and an IC chip having electrodes bonded to the leads through bumps, and includes a feature wherein the TCP can be made smaller and thinner as compared with other packages.

On the other hand, the TSOP represents an SOP having a thickness of a chip reduced from 0.4–0.5 mm to about 0.25–0.3 mm, a size of a lead frame reduced to about 0.5–0.2 mm, a height of a wire bonding structure reduced from 0.2–0.3 mm to 0.1–0.15 mm, a thickness of upper and lower plastics reduced from about 1 mm to about 0.15–0.25 mm and a thickness of an overall package reduced to about 0.8–1.2 mm, while an overall thickness of a plastic molded package is usually about 3 to 4 mm.

Techniques relating to a laminated semi-conductor device are publicly known in, for example, U.S. Pat. No. 4,996,583 disclosing a high-density mounting technique in which a plurality of TCP's are stacked. As shown in FIG. 21, the laminated semiconductor device includes four positioning pins 102 mounted on a base 106 at front, rear, right and left portions thereof, while a printed wiring board 100 is formed with holes 107 through which the positioning pins 102 are inserted.

The positioning pins 102 are inserted into the holes 107 so that the printed wiring board 100 is mounted on the base 106. Four TCP's 101 are stacked on the printed wiring board 100 and aligned vertically by means of the positioning pins 102. Then, stacked outer connection leads 103 previously plated with solder are subjected to thermo-compression bonding or heated and pressure joined by a pulse heat tool 104 from above the connection leads to bond the outer connection leads 103 to one another and lowermost leads 103 are soldered to terminal portions 105 formed on the printed wiring board 100. FIG. 22 is a partially enlarged sectional view illustrating the TCP's 101 mounted on the printed wiring board 100. In FIG. 22, numeral 108 denotes film of synthetic resins of the TCP 101 and numeral 105 denotes a semiconductor chip.

In the conventional laminated semiconductor device, as shown in FIG. 22, since the leads 103 are mounted with the tips 103a of the leads being bent upward, the fixed leads 103 tend to be separated from the tips 103a thereof and connection failure of the TCP's 101 is caused.

Further, since it is necessary to form the holes 107 in the printed wiring board 100, the printed wiring pattern is required to be designed to avoid the holes 107 and is thus redundant and complicated.

In addition, since the laminated outer connection leads are heated and pressure joined by the pulse heat tool 104 on the printed wiring board 100, the printed wiring of the printed wiring board is cut to thereby reduce the yield in manufacturing of a memory card.

Furthermore, since there are the upward bent tips 103a, an occupied area S by the TCP's 101 on the printed wiring board 100 is naturally increased to thereby impede the mounting of other electronic components and make it impossible to take sufficient space between the TCP's and the other electronic components, so that there is a possibility that the TCP's and the electronic components come into contact with each other.

In order to avoid the above problems, it is suggested that the upward bent tips 103a be cut off, although the working processes are increased so that the efficiency is deteriorated and the leads 103 are separated upon cutting of the tips so that connection failure occurs.

Further, instead of the heating and pressure joining of the connection leads by the pulse heat tool as described above, there is a reflow method in which a necessary number of TCP's which are stacked and put on the printed wiring board 100 pass through a heating furnace so that the stacked TCP's 101 are connected to the printed wiring board 100, but it is difficult to apply this method to the heating and pressure joining of the leads.

More particularly, since the leads 103 of the TCP's 101 are apt to be deformed easily because a thickness of the leads is as thin as about 35 μm in recent years or the tips of the leads 103 are separated from other leads 103 by the springback upon molding of the leads 103, the bonding between the leads 103 or/and between the leads 103 and the terminals of the printed wiring board 100 is apt to be unreliable and accordingly application of the reflow method which attains good productivity is difficult.

SUMMARY OF THE INVENTION

It is an object of the present invention to provide a reliable laminated semiconductor device and a fabricating method thereof having excellent mass-productivity and attaining reliable bonding between leads of TCP's and between the leads and terminals of a printed wiring board.

In order to achieve the above object, the present invention is directed to a fabricating method of a laminated semiconductor device including two or more stacked IC packages such as, for example, TCP's mounted on at least one side of a printed wiring board and outer connection leads provided in the IC packages and stacked to be connected to terminal portions of the printed wiring board.

The fabricating method comprises:

a step of stacking two or more IC packages and aligning outer connection leads of the IC packages in the stacked direction, a step of temporarily bonding the stacked outer connection leads to each other by means of solder or adhesive, for example, to combine the stacked IC packages into a single block, and a step of mounting the block on the printed wiring board and passing terminal portions formed on the printed wiring board and lowermost outer connection leads of the block through a heating furnace to solder them.

Further, in order to achieve the above object, the present invention is directed to a laminated semiconductor device including a plurality of IC packages such as, for example, TCP's being stacked and mounted on a printed wiring board and outer connection leads provided in the IC packages and stacked to be connected to terminal portions of the printed wiring board.

Thus, the present invention includes a feature wherein the stacked outer connection leads are integrally connected to each other by means of adhesive in the stacked direction.

Further, as described above, according to the present invention, since the stacked outer connection leads are integrally bonded to each other by means of adhesive, there are no problems whereby the leads are separated to cause the connection failure of the IC packages and the separated leads to come into contact with adjacent leads, so that connection between the leads and between the leads and the terminal portions of the printed wiring board is made secure to improve the reliability of the operation.

In addition, in the present invention, since it is not necessary to form in the printed wiring board holes for the positioning pins for positioning the IC packages in the stacked direction as in the prior art, it is not necessary that the printed wiring pattern be designed to avoid the holes and, accordingly the printed wiring pattern and the wiring design are made simple.

Furthermore, since the excessive portions formed by the upwardly bent tips of the leads as in the prior art are not formed, the occupied area of the IC packages on the printed wiring board is reduced so that space between the IC packages and other electronic components can be provided sufficiently and the mounting density of various electronic components can be increased.

As described above, according to the present invention, since the stacked outer connection leads are first temporarily bonded to each other and then parmanently or fixedly bonded without separation of the leads, the stacked IC packages can be treated as one block, that is, as one electronic component. Thus, the block or the block and other electronic components are put on the printed wiring board together and pass through the heating furnace, so that the connection leads can be automatically and effectively soldered to thereby improve the productivity.

BRIEF DESCRIPTION OF THE DRAWINGS

FIG. 10 is a partial perspective view schematically illustrating stacked TCP's mounted on a printed wiring board according to a second embodiment of the present invention;

FIG. 11 is a side view for explaining a positioning method of the TCP's;

FIG. 21 is a side view schematically illustrating a conventional laminated semiconductor device being on the way of manufacturing; and FIG. 22 is a partially enlarged sectional view of the laminated semiconductor device of FIG. 21.

DESCRIPTION OF THE PREFERRED EMBODIMENTS

Figure 1:
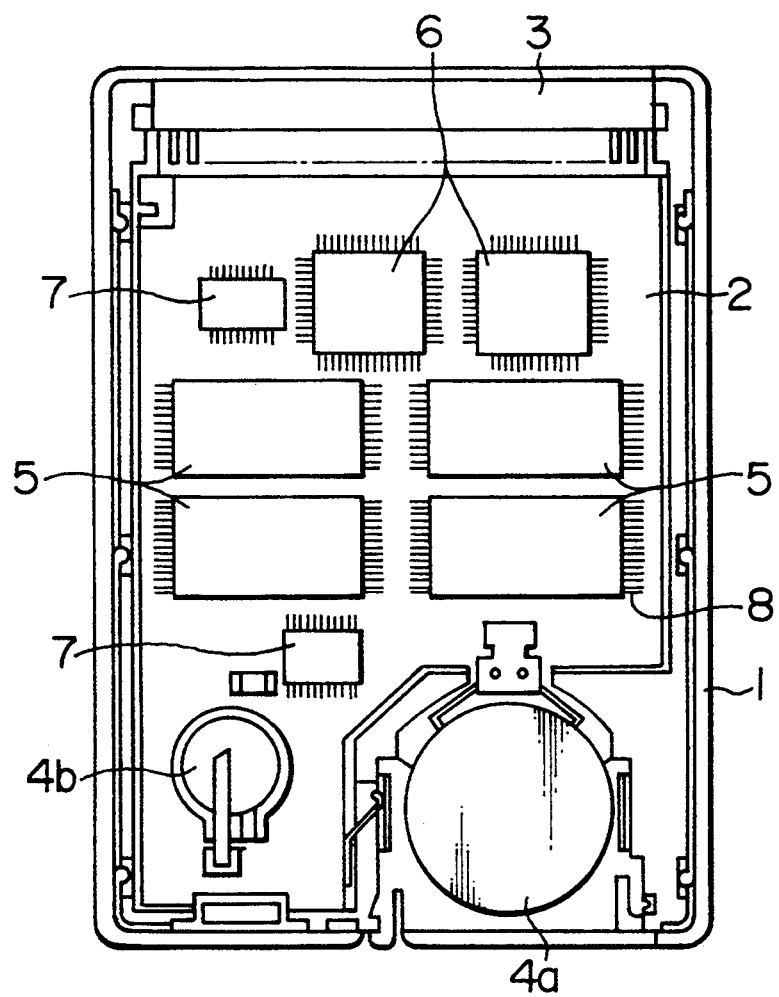
FIG. 1 is a plan view of a laminated semiconductor device according to a first embodiment of the present invention with a lid plate thereof being removed.

Embodiments of the present invention are now described with reference to the accompanying drawings. FIG. 1 is a plan view schematically illustrating a laminated semiconductor device according to an embodiment of the present invention with a lid plate being removed. First of all, the overall configuration of the laminated semiconductor device is described with reference to FIG. 1.

The laminated semiconductor device mainly comprises a frame 1 molded with synthetic resin, a printed wiring board 2 mounted in the frame 1, a connector 3 attached to the printed wiring board 2, a primary battery 4a and a secondary battery 4b serving as a backup power supply, and lid plates (not shown) made of thin metal plate for covering upper and lower openings of the frame 1.

Mounted on the printed wiring board 2 are various electronic components including a plurality (four in the embodiment) of stacked TCP's 5 with IC chips (SRAM), gate arrays 6 and condensers 7.

A number of outer connection leads 8 are attached on the both sides of the TCP's 5. In the embodiment, the outer leads 8 are made of electrolyzed copper foil with a thickness of 35 $\mu$m, a width of 200 $\mu$m and a pitch or space between the outer leads 8 of 500 $\mu$m.

Figure 2:
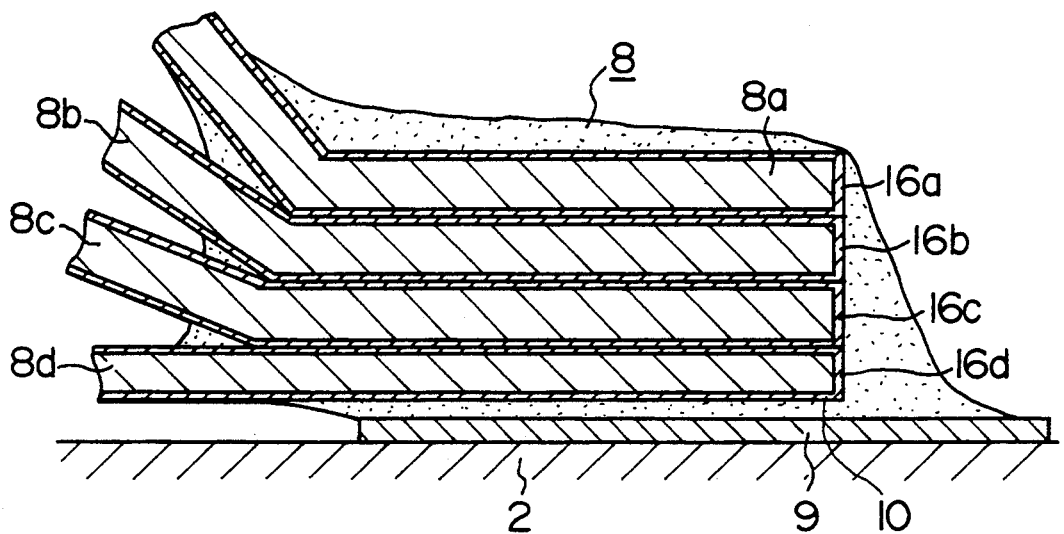
FIG. 2 is a partially enlarged sectional view of a TCP mounted on a printed wiring board.

As shown in FIG. 2, four leads 8a to 8d are stacked to be coupled with each other and connected to a terminal portion 9 of the printed wiring board 2 through a solder layer 10.

Figure 6:
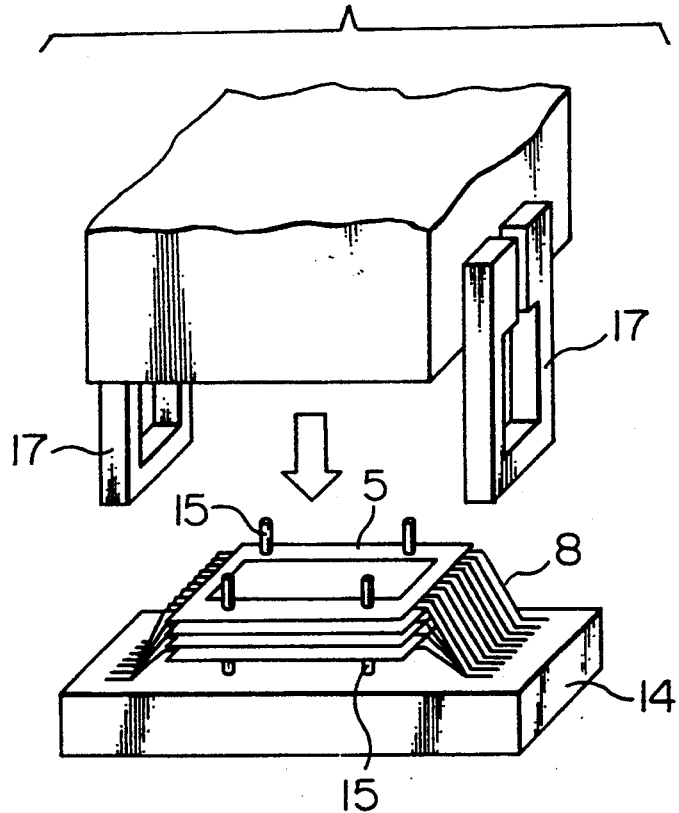
FIG. 6 is a partial side view illustrating outer leads which are being temporarily bonded.
Figure 7:
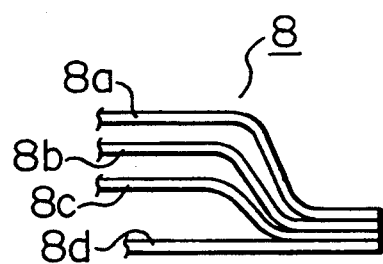
FIG. 7 is a partial side view illustrating the outer leads which have been temporarily bonded.
Figure 8:
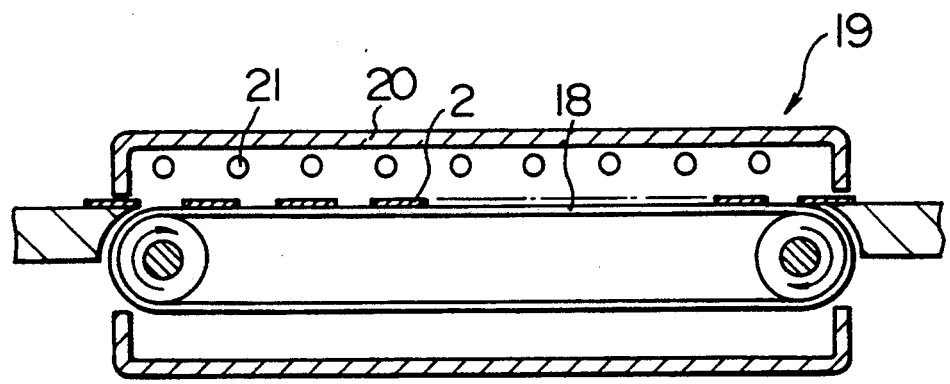
FIG. 8 is a sectional view of a heating furnace for attaching electronic components to a printed wiring board.

A mounting method of the TCP's 5 on the printed wiring board 2 is now described with reference to FIGS. 2 to 8. FIG. 2 is a partially enlarged sectional view schematically illustrating the TCP's 5 mounted on the printed wiring board 2, FIG. 3 is a flow chart for explaining a mounting procedure of the TCP's 5, FIG. 6 is a partial side view schematically illustrating outer leads 8 which are being temporarily bonded, FIG. 7 is a partial side view schematically illustrating the outer leads 8 which have been temporarily bonded, and FIG. 8 is a sectional view of a heating furnace for attaching various electronic components on the printed wiring board.

Figure 3:
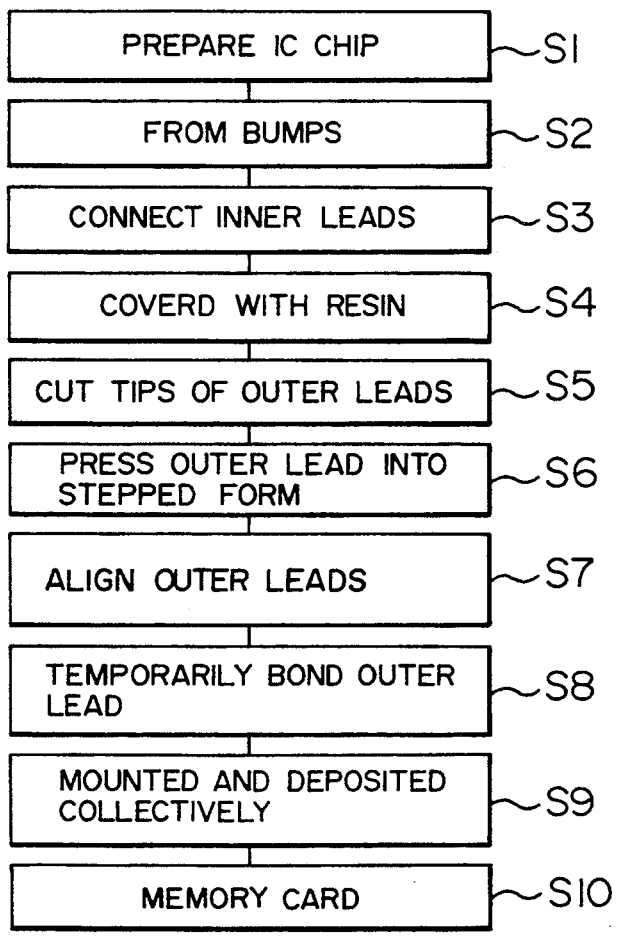
FIG. 3 is a flow chart for explaining the mounting procedure of a TCP.

Referring now to FIG. 3, the overall flow of the mounting procedure of the TCP's 5 is described. As shown in FIG. 3, an IC chip is prepared in step S1 and bumps for connecting to the TCP are formed in the tips of inner leads of the IC chip in step S2, so that the tips of the inner leads are connected to the TCP in step S3.

The external surface of the IC chip and the surface of the connected portion of the IC chip and the TCP are covered with resin for protection thereof in step S4. Then, in step S5, unnecessary portions of the tips of the outer leads are cut, and the outer leads are pressed into a stepped form in step S6. The TCP's with the IC chips are stacked and the outer leads thereof are aligned with each other in step S7. Then, the outer leads are temporarily bonded to one another to combine the stacked TCP's into a single block in step S8.

Then, electronic components including the block are put on the printed wiring board and passed through the heating furnace, so that the electronic components are deposited or welded onto the printed wiring board collectively in step S9. In step S10, this printed wiring board is used to assemble a memory card.

Figure 4:
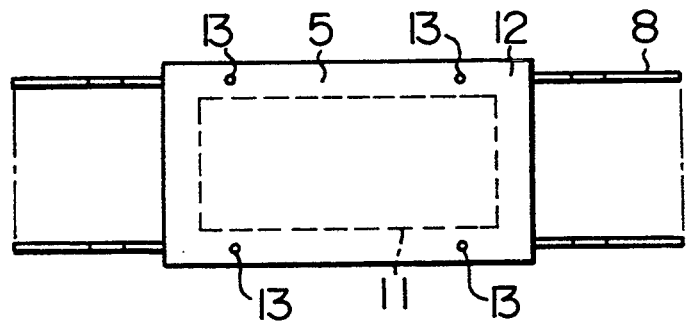
FIG. 4 is a plan view of the TCP.

FIG. 4 is a plan view of the TCP 5 having the outer leads 8 pressed into the stepped form in the step S6. As shown in FIG. 4, four positioning holes 13 are preformed in an outer peripheral film portion 12, in which the IC chip of the TCP 5 is not mounted thereby avoiding the IC chip.

Figure 5:
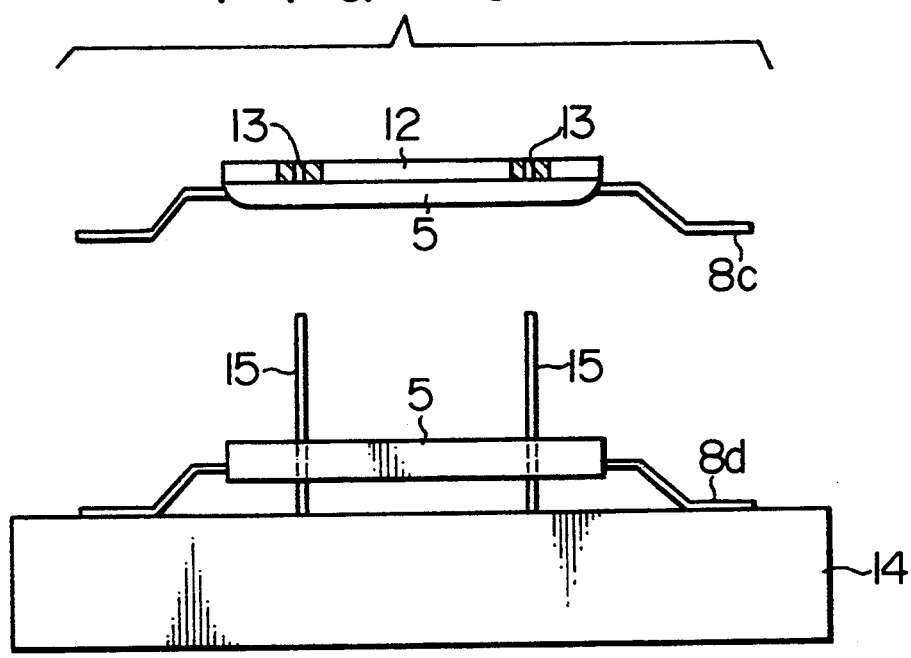
FIG. 5 is a partially sectional side view for explaining a positioning method of the TCP's.

FIG. 5 schematically illustrates the aligning method of the outer leads in the step S7. Four positioning pins 15 are mounted in a base 14 and the four TCP's 5 are stacked on the base 14 while inserting the positioning pins 15 into the positioning holes 13 of the TCP's 5. In this manner, by inserting the positioning pins 15 into the positioning holes 13, the TCP's 5 are stacked so that the outer leads 8a to 8d are aligned with each other in the stacked direction.

FIG. 6 schematically illustrates a method of temporarily bonding the outer leads in the step S8. As shown in FIG. 2, solder plated layers 16a to 16d are provided on the surfaces of the outer leads 8a to 8d. As shown in FIG. 6, the stacked outer leads 8a to 8d are heated at 300° C. for example, to be pressure joined by the pulse heat tool 17 from above the stacked outer leads as shown in FIG. 6, so that the solder plated layers 16a to 16d are welded to bond the outer leads 8a to 8d to one another. FIG. 7 schematically illustrates the stacked outer leads 8a to 8d separated from the base 14 in which the pulse heat tool 17 is removed. As shown in FIG. 7, the outer leads 8a to 8d are temporarily bonded to one another and the four stacked TCP's 5 are formed into one block and treated as a single component.

At least the surface of the base 14 is formed of a heat-resistant material, such as polyethylene having a super-macromolecular weight or fluoroplastics such as polytetrafluoroethylene, which material is not wetted to the solder plated layer 16 of the outer lead 8.

The solder plated layers 16a to 16d are made of an alloy such as, for example, 10 wt % Pb-90 wt % Sn (melting point 220° C.) and 35 wt % Pb-65 wt % Sn (melting point 183° C.). A proper thickness thereof is 1 to 20 μm and in the embodiment the thickness is 5 μm.

The block of the four-stacked TCP's 5 constructed above and other electronic components (gate arrays 6, condensers 7 and the like) are mounted in place on the printed wiring board and then passed through the heating furnace 19 by means of a belt conveyer 18, as shown in FIG. 8. In FIG. 8, there is seen a casing 20 and heater 21 of the heating furnace 19. In the embodiment, a maximum temperature in the furnace is set to 190° to 230° C.

As shown in FIG. 2, since a solder layer 10 (which is an alloy layer made of 35 wt % Pb-65 wt%Sn having a thickness of 120 μm and a melting point of 183° C. in the embodiment) is previously formed on the terminal portions 9 of the printed wiring board 2, the solder layer 10 on the terminal portions 9 and the solder on the temporarily bonded outer leads 8a to 8d are melted to connect the lowermost outer lead 8d and the terminal portion 9 while maintaining the bonding of the outer leads 8a to 8d by passing the printed wiring board 2 through the heating furnace at a predetermined speed. In FIG. 2, while the solder layer 10 on the terminal portion 9 and the solder plated layers 16a to 16d on the outer leads 8a and 8d are illustrated separately for the convenience of description, both of them are mixed in actuality after they have passed through the heating furnace 19.

Even if the alloy composition of the solder plated layers 16a to 16d and the solder layer 10 on the terminal portion 9 are the same, there is no problem.

Figure 9:
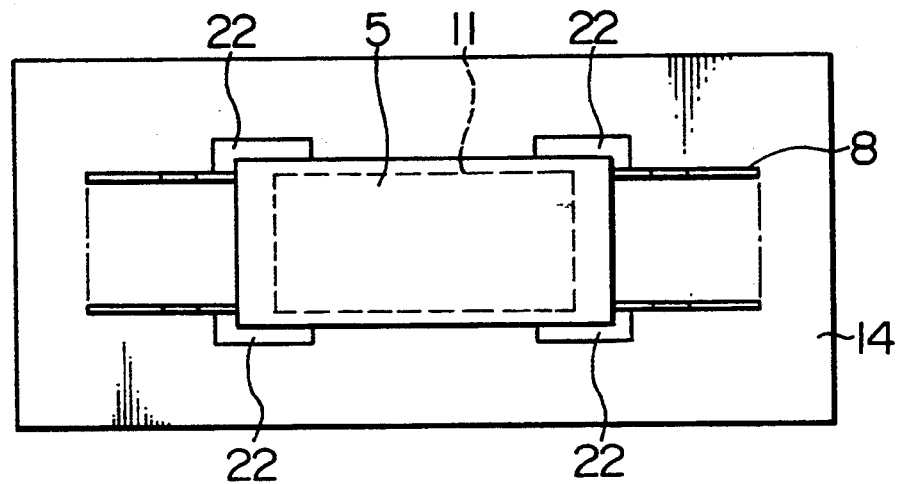
FIG. 9 is a plan view illustrating a modification of a positioning method of the TCP's.

FIG. 9 schematically illustrates a modification of the positioning method of the TCP's 5 on the base 14. In this modification, L-shaped engagement pieces 22 are provided in the base 14 to come into contact with external peripheral edges, such as four corners of the TCP 5, so that the outer leads 8a to 8d of the TCP's 5 are aligned with each other in the vertical direction.

In the first embodiment, as shown in FIG. 4, a width of the TCP 5 in the vertical direction is necessarily long since the positioning holes 13 are formed in the external peripheral film portion 12, while in the modification of FIG. 9 since the external peripheral edges of the TCP 5 are used for the positioning, the positioning holes 13 are not necessary. Accordingly, the vertical width of the TCP 5 can be narrowed so that the space for mounting the components can be increased in the printed wiring board 2 to thereby increase the mounting density of the electronic components.

Figure 12:
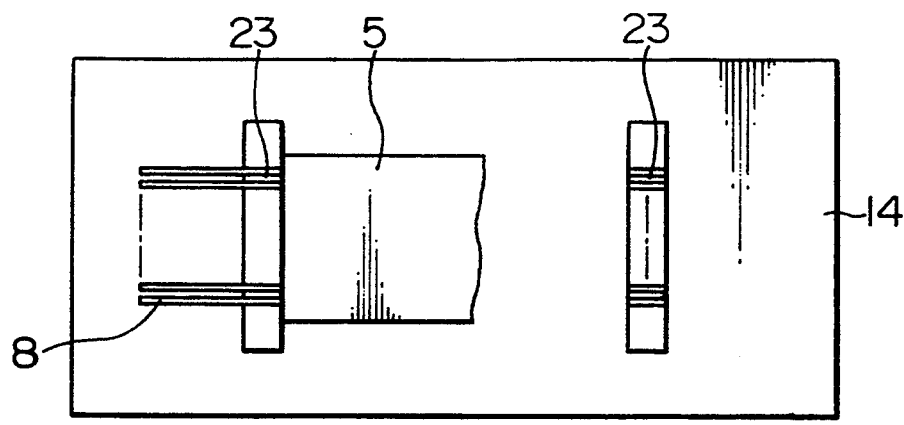
FIG. 12 is a plan view for explaining the positioning method of the TCP's.
Figure 13:
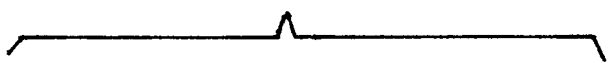
FIG. 13 is a partially enlarged sectional view for explaining the positioning method of the TCP's.
Figure 13:
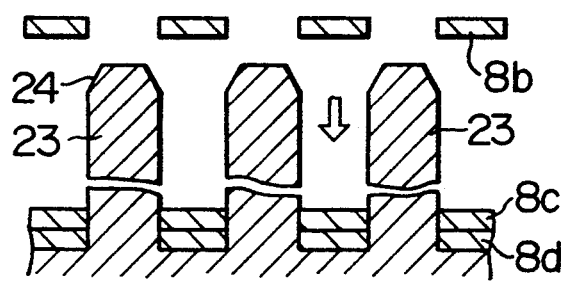
Figure 14:
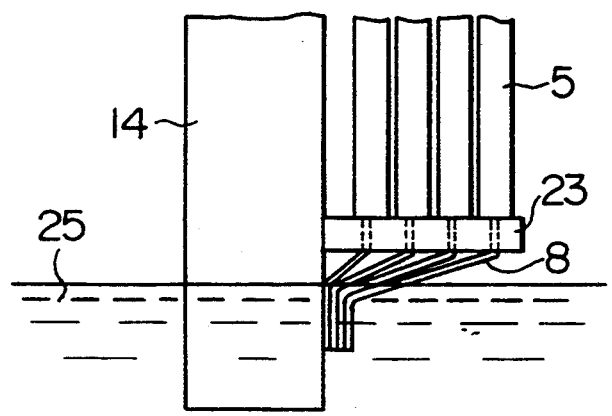
FIG. 14 schematically illustrates a process of applying adhesive to terminals of the stacked outer leads.
Figure 15:
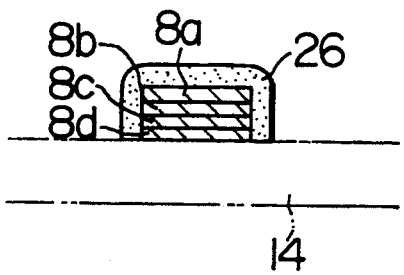
FIG. 15 is a partially enlarged sectional view illustrating the outer leads temporarily bonded.

Referring now to FIGS. 10 to 15, a second embodiment is described. FIG. 10 is a partial perspective view schematically illustrating the stacked TCP's 5 mounted on the printed wiring board 2, FIGS. 11, 12 and 13 are a side view, a plan view and a partially enlarged sectional view for explaining the positioning method of the TCP 5, respectively, FIG. 14 schematically illustrates a process of applying adhesive to end portions of the stacked outer leads 8a to 8d, and FIG. 15 is a partially enlarged sectional view schematically illustrating the temporarily bonded outer leads 8a to 8d.

In this embodiment, two comb-tooth portions 23 are disposed in opposing relationship with each other on the base 14 and the space between each of the teeth of the combs 23 is substantially identical with the width of the outer leads 8, as shown in FIG. 13. As shown in FIG. 13, the comb is formed at an end portion thereof with a tapered or arcuate guide portions 24 to facilitate insertion of the outer leads 8.

The TCP's 5 are stacked while portions near the roots of the outer leads 8 are inserted into the teeth of the comb 23, so that the outer leads 8a to 8d are aligned with each other in the stacked direction. FIG. 12 illustrates the TCP's 5 partially cut away in order to depict the comb-tooth portions 23.

Both ends of the outer leads 8a to 8d and the base 14 are immersed into an adhesive solution 25 while retaining the stacked TCP's 5 on the base 14, and are pulled up therefrom to form an adhesive layer 26 around the outer leads 8a to 8d (see FIG. 15).

The base 14 is made of a material difficult to wet to the adhesive solution 25, such as super-macromolecular polyethylene or fluoroplastics such as polytetrafluoroethylene. Furthermore, since the lowermost outer leads 8d are in close contact with the base 14, the adhesive layer 26 is not formed on the surface of the lowermost outer leads 8d to be brought into contact with the terminal portion 9 and other periphery, except that surface of the lowermost outer lead surrounded by the adhesive layer 26.

The adhesive is made of thermosetting resin such as, for example, silicone resin, epoxy resin, phenolic resin and unsaturated polyester resin. Further, the adhesive can be also made of optically hardening resin such as ultraviolet hardening resin or electron beam hardening resin. The optically hardening resin is hardened in a short time (for example, ultra-violet rays are irradiated with 100 W for 30 seconds) and preferably hardened in the bridging manner without heating or addition of catalyst.

When the thermosetting resin is used as the adhesive, the adhesive layer 26 is formed and then heated. When the ultraviolet hardening resin is used as the adhesive, the adhesive layer 26 is formed and then irradiated with ultraviolet rays. When the electron beam hardening resin is used as the adhesive, the adhesive layer 26 is formed and then irradiated with an electron beam. Thus, bridging reaction is produced in the adhesive layer 26 to form the three-dimensional mesh structure and the adhesive layer 26 is hardened to temporarily bond the outer leads 8a to 8d securely.

Further, resin which is optically hardened and then thermally hardened may be used as the adhesive.

In the embodiment, the application of the adhesive is made by immersing both ends of the outer leads 8a to 8d into the adhesive solution 25, while the application of the adhesive can be made by dropping the adhesive onto the ends of the outer leads 8a to 8d.

Thereafter, in the same manner as the first embodiment, the electronic components such as the stacked TCP's 5 and the gate arrays 6 are put in place on the printed wiring board 2 and pass through the heating furnace as shown in FIG. 8, so that the electronic components can be welded onto the printed wiring board 2 collectively.

Figure 16:
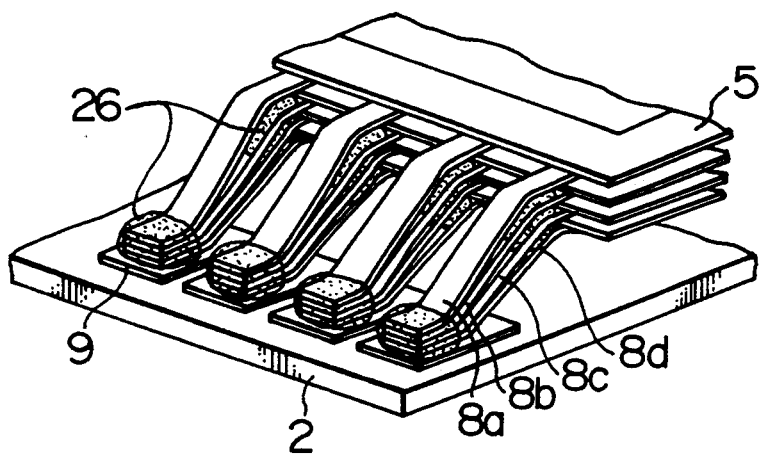
FIG. 16 is a partial perspective view schematically illustrating a modification of the stacked TCP's mounted on a printed wiring board.

FIG. 16 schematically illustrates a modification of the second embodiment. In this modification, portions near the roots of the outer leads 8a to 8d are also connected by means of the adhesive layer 26 to strongly make the temporary bonding of the outer leads 8a to 8d. The adhesive layer 26 may be an insulative adhesive in the same manner as the second embodiment or may be conductive adhesive mixed with a proper amount of conductive filler such as silver powder or carbon black.

Figure 17:
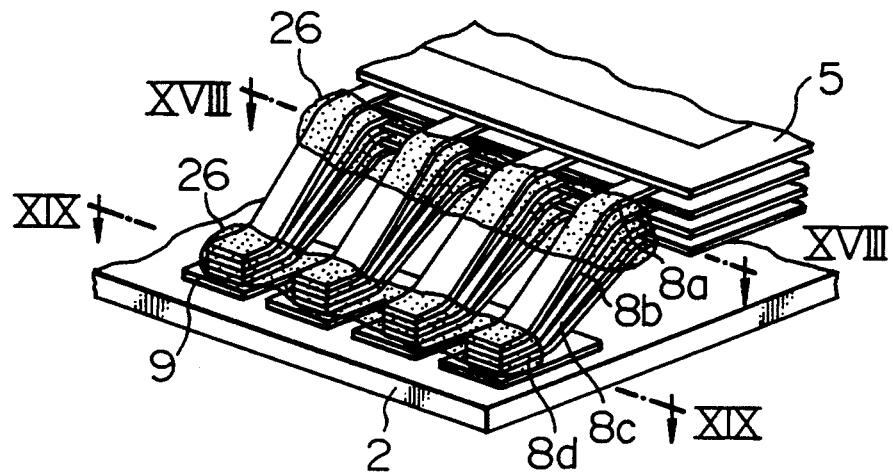
FIG. 17 is a perspective view schematically illustrating part of another modification of the stacked TCP's mounted on the printed wiring board.
Figure 18:
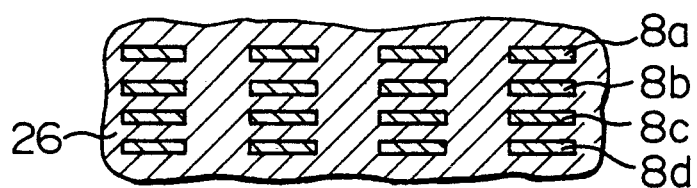
FIG. 18 is an enlarged sectional view taken along line I—I of FIG. 17.
Figure 19:
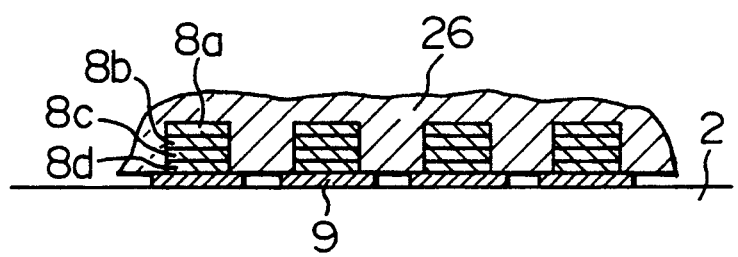
FIG. 19 is an enlarged sectional view taken along line II—II of FIG. 17.

FIGS. 17 to 19 schematically illustrate another modification of the second embodiment. FIG. 18 is an enlarged sectional view taken along line XVIII—VIII of FIG. 17 and FIG. 19 is an enlarged sectional view taken along line XIX—XIX of FIG. 17.

In the modification, the laminated outer leads 8 including the stacked outer leads 8a to 8d are connected with the adjacent laminated outer leads 8 integrally by means of continuous adhesive layer 26 having electrical insulation characteristic at two portions of the tip and portions near the root of the outer leads 8a to 8d.

In the modification, the two portions of the tips and the portions near the root of the outer leads 8a to 8d are connected, while only the tips of the outer leads 8a to 8d or substantially the whole outer leads extending from the tips to the portions near the root of the outer leads 8a to 8d may be connected integrally by the adhesive layer 26. In this manner, by integrally connecting at least the tips of the outer leads 8a to 8d, the tips of the stacked outer leads 8a to 8d can be aligned with each other vertically and horizontally and fixed.

Figure 20:
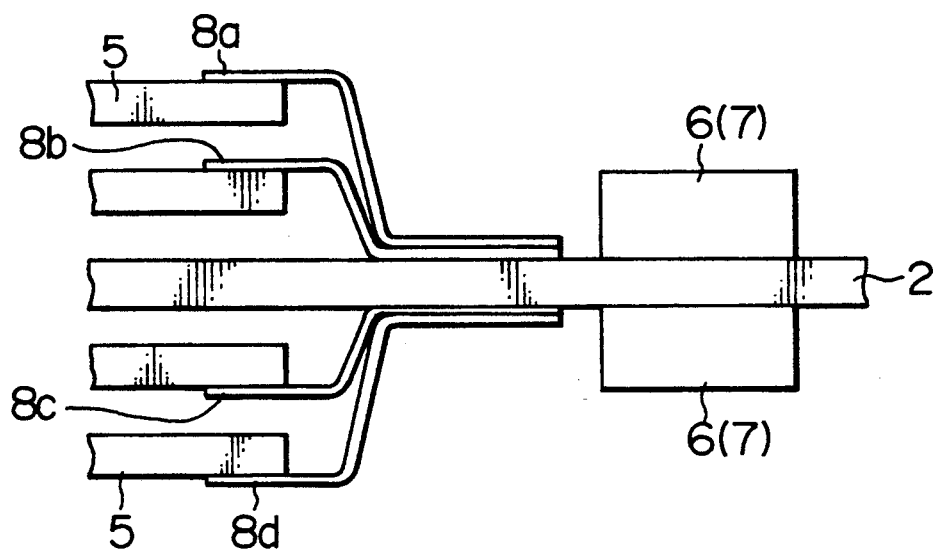
FIG. 20 is a side view schematically illustrating a modification of an arrangement of the stacked TCP.

FIG. 20 schematically illustrates a modified arrangement of the laminated TCP's 5. In the above-mentioned embodiment, the four stacked TCP's 5 are mounted on one side of the printed wiring board 2, while in this modification of FIG. 17 the printed wiring board 2 having both sides on which conductive patterns are formed is employed to mount two stacked TCP's 5 on both sides of the printed wiring board 2.

In FIG. 20, numerals 6 and 7 denote other electronic components such as the gate arrays 6, the condensers 7 or a backup battery mounted on both sides of the printed wiring board 2.

When the two TCP's 5 are stacked as in the modification, the TCP's 5 can be sucked by a suction nozzle and the outer leads 8 can be positioned while monitoring coordinates of the outer leads 8 of the TCP's by a CCD.

Furthermore, the positioning method using the positioning pins 15, the engagement pieces 22 and the suction means can be applied to the method of forming the adhesive layer 26 onto the outer leads 8, and the positioning method using the comb 23 and the suction means can be also applied to the method using the pulse heat tool 17.

In the embodiments and the modifications, the TCP is used as the IC packages, the present invention can be applied to other packages such as TSOP.

As described above, according to the present invention, since the stacked outer leads are temporarily bonded and fixed without separation, the laminated tape carrier package can be treated as one block, that is, one electronic component. Accordingly, the blocks or the blocks and other electronic components are put on the printed wiring board together and pass through the heating furnace, so that soldering can be effectively made automatically to improve the productivity.

Further, as described above, according to the present invention, since the stacked connection outer leads are integrally bonded to one another by adhesive, there is no problem such as separation of the leads, connection failure of the TCP's and contact of the separated lead with an adjacent lead, and connection between the leads and between the leads and the terminal portions of the printed wiring board is securely made and the operational reliability can be improved.

In addition, according to the present invention, since it is not necessary to form in the printed wiring board holes for the position pins for positioning the IC packages in the stacked direction as in the prior art, it is not necessary to design the printed wiring pattern to avoid the holes and accordingly the printed wiring pattern and the wiring design can be simplified.

Furthermore, since there is no upward bent portion at the tip of the leads as provided in the conventional leads, the occupied area of the IC packages on the printed wiring area can be reduced, so that space between the TCP's and other electronic components can be obtained sufficiently and the mounting density of various electronic components can be increased.

The present invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. A method of fabricating a laminated semiconductor device including two or more semiconductor chips stacked as IC packages and mounted on at least one side of a printed wiring board and outer connection leads provided in said IC packages and stacked to be connected to terminals of said printed wiring board, comprising:

press forming outer connection leads provided in each of said IC packages to be laminated;

stacking two or more IC packages for which said outer connection leads are press formed and aligning said outer connection leads of said IC packages in the stacked direction;

temporarily bonding said stacked outer connection leads to each other to combine said stacked IC packages into a single block; and placing said block on said printed board and passing it through a heating furnace to solder terminal portions formed on said printed wiring board and lowermost outer connection leads of said block.

2. A fabricating method of a laminated semiconductor device according to claim 1, wherein a solder plated layer is previously provided on surfaces of said outer connection leads and said solder plated layer is melted to temporarily bond said outer connection leads to each other by heating and pressure joining said stacked outer connection leads.

3. A fabricating method of laminated semiconductor device according to claim 2, wherein said stacked outer connection leads are placed on a base having at least a surface made of heat-resistant material difficult to wet to solder and are heated and pressure joined.

4. A fabricating method of a laminated semiconductor device according to claim 1, wherein said stacked outer connection leads are applied with adhesive to be temporarily bonded to each other.

5. A fabricating method of a laminated semiconductor device according to claim 4, wherein said stacked outer connection leads are surrounded by said adhesive except a surface opposite to the terminal portions of said printed wiring board.

6. A fabricating method of a laminated semiconductor device according to claim 5, wherein said stacked outer connection leads abut against a base having at least a surface made of material difficult to wet to said adhesive and are applied with adhesive.

7. A fabricating method of a laminated semiconductor device according to claim 3 or 6, wherein at least the surface of said base is made of fluoroplastics.

8. A fabricating method of a laminated semiconductor device according to claim 4, wherein said heat-resistant adhesive comprises an optically hardening resin.

9. A fabricating method of a laminated semiconductor device according to claim 4, wherein said heat-resistant adhesive comprises a thermosetting resin.

10. A fabricating method of a laminated semiconductor device according to claim 1, wherein positioning portions are provided in part of said IC packages and a plurality of positioning members are projected with predetermined space on a base on which said IC packages are stacked, said IC packages being successively inserted between said positioning members, thereby aligning said outer connection leads of said IC packages in the stacked direction.

11. A fabricating method of a laminated semiconductor device according to claim 10, wherein said positioning portions comprise a plurality of holes formed in a portion of said IC package in which said semiconductor chip is not mounted and said positioning members comprise pins disposed in said base and inserted into said holes.

12. A fabricating method of a laminated semiconductor device according to claim 10, wherein said positioning portions comprise peripheral edges of said IC package and said positioning members comprise projections disposed in said base and abutting against said peripheral edges of said IC package.

13. A fabricating method of a laminated semiconductor device according to claim 10, wherein comb-tooth-shaped positioning members having a number of teeth each corresponding to a width of said outer connection leads of said IC package are disposed with a predetermined space in opposing relationship with each other on said base on which said IC packages are stacked and said IC packages are successively inserted between said positioning members, said outer connection leads being inserted into the teeth of said comb-tooth portion to thereby align said outer connection leads in the stacked direction.

14. A fabricating method of a laminated semiconductor device according to claim 10, wherein at least a surface of said base is made of material which is heat-resistant and difficult to wet to solder, and a solder plated layer is previously provided on surfaces of said outer connection leads, the stacked outer connection leads on said base being heated and pressure joined to thereby melt said solder plated layer and temporarily bond said outer connection leads to each other.

15. A fabricating method of a laminated semiconductor device according to claim 10, wherein at least a surface of said base is made of material difficult to wet to adhesive, and said outer connection leads are stacked on said base to be applied with adhesive while lowermost outer connection leads abut against said base, so that said outer connection leads are temporarily bonded by the adhesive to each other.

16. A fabricating method of a laminated semiconductor device according to claim 10, wherein said block constituted by said stacked IC packages and other electronic components are put on said printed wiring board and pass through said heating furnace to thereby deposit said block and other electronic components on said printed wiring board collectively.

* * * * *